(12) United States Patent
May et al.

(10) Patent No.: US 10,187,025 B1
(45) Date of Patent: Jan. 22, 2019

(54) SYSTEMS AND METHODS FOR PREDICTIVELY PREVENTING A BROWNOUT CONDITION IN A PERSONAL AUDIO DEVICE

(71) Applicant: Cirrus Logic, Inc., Austin, TX (US)

(72) Inventors: Jeffrey Allen May, Dripping Springs, TX (US); Anu Chakravarty, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 68 days.

(21) Appl. No.: 14/169,349

(22) Filed: Jan. 31, 2014

Related U.S. Application Data

(60) Provisional application No. 61/834,696, filed on Jun. 13, 2013.

(51) Int. Cl.
*G06F 1/32* (2006.01)
*H03G 3/20* (2006.01)

(52) U.S. Cl.
CPC ............. *H03G 3/20* (2013.01); *G06F 1/3212* (2013.01)

(58) Field of Classification Search
None
See application file for complete search history.

(56) References Cited

U.S. PATENT DOCUMENTS

| | | | |
|---|---|---|---|
| 4,873,493 A * | 10/1989 | Fujiwara | H03F 1/0244 330/134 |
| 6,417,659 B1 | 7/2002 | Schroeder | |
| 2001/0048292 A1 | 12/2001 | Wahl | |
| 2007/0140513 A1 * | 6/2007 | Furge | H03F 1/32 381/120 |
| 2009/0271186 A1 * | 10/2009 | LeBlanc | G10L 21/02 704/226 |

(Continued)

FOREIGN PATENT DOCUMENTS

| | | |
|---|---|---|
| EP | 2712209 A1 | 3/2014 |
| WO | 2016040177 A1 | 3/2016 |
| WO | 2017087246 A1 | 5/2017 |

OTHER PUBLICATIONS

"Soft Clippers." Native Instruments. Mar. 4, 2007. Web. <https://www.native-instruments.com/forum/threads/soft-clippers.46859/>.*

(Continued)

*Primary Examiner* — James Mooney
(74) *Attorney, Agent, or Firm* — Jackson Walker L.L.P.

(57) ABSTRACT

A predictive brownout prevention system may be configured to prevent brownout of an audio output signal. Particularly, the brownout prevention system may be configured to receive information indicative of an amplitude of the audio input signal, receive information indicative of a condition of the power supply, determine from the information indicative of an amplitude of the audio input signal and the information indicative of the condition of the power supply whether a brownout condition exists, and responsive to determining the brownout condition exists, generate the selectable attenuation signal to reduce an amplitude of the audio output signal such that the signal path attenuates the audio input signal or a derivative thereof in order to prevent brownout prior to propagation to the audio output of a portion of the audio input signal having the brownout condition.

28 Claims, 6 Drawing Sheets

(56) References Cited

U.S. PATENT DOCUMENTS

| | | | | |
|---|---|---|---|---|
| 2010/0321115 A1* | 12/2010 | Mohajeri | ............... | H03F 1/025 |
| | | | | 330/297 |
| 2012/0177226 A1* | 7/2012 | Silverstein | ............ | G06F 1/3212 |
| | | | | 381/107 |
| 2013/0311794 A1* | 11/2013 | Stewart | .................... | G06F 1/26 |
| | | | | 713/300 |
| 2015/0263688 A1 | 9/2015 | Nicolino, Jr. et al. | | |
| 2016/0126899 A1 | 5/2016 | Doy | | |

OTHER PUBLICATIONS

"Battery Performance Characteristics." Electropaedia. 2004. Web. <http://www.mpoweruk.com/performance.htm>.*

Combined Search and Examination Report under Sections 17 and 18(3), UKIPO, Application No. GB1706283.7, dated Oct. 20, 2017.

International Search Report and Written Opinion of the International Searching Authority, International Application No. PCT/US2017/036157, dated Jan. 17, 2018.

* cited by examiner

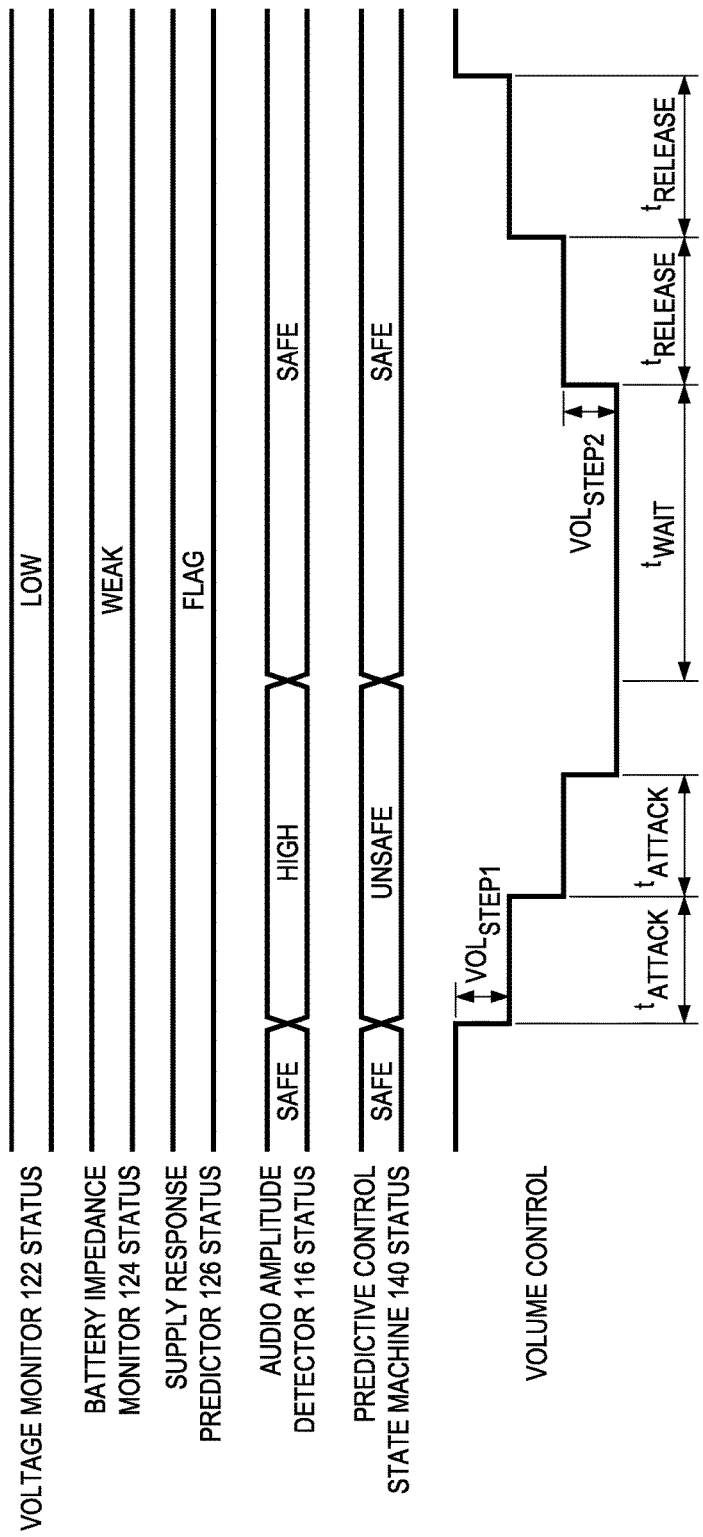

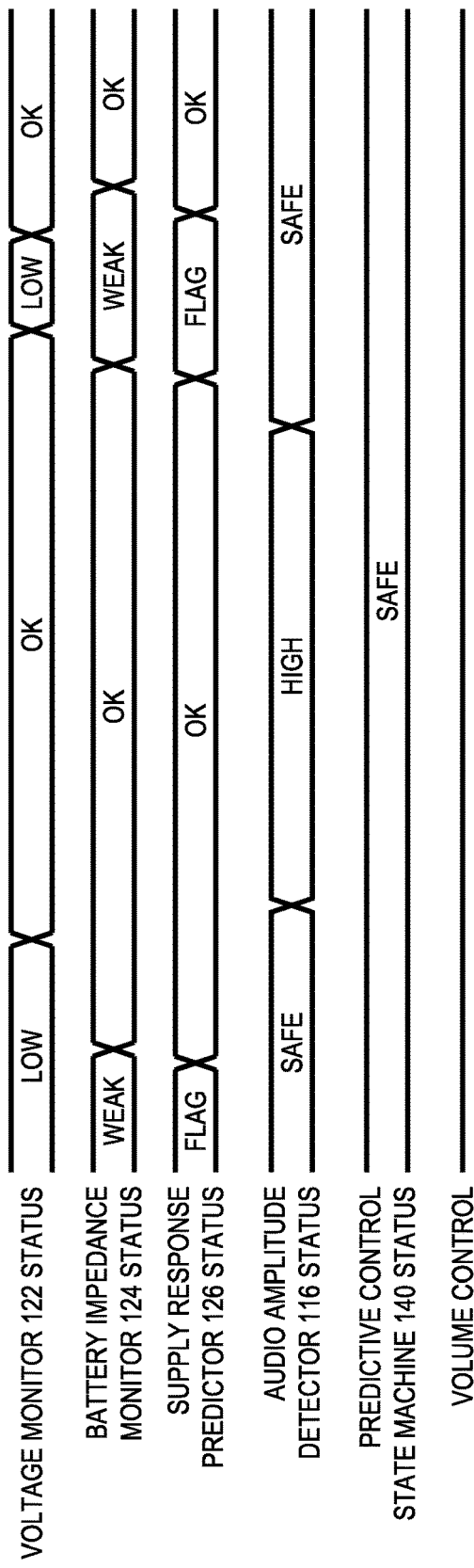

SYSTEMS AND METHODS FOR PREDICTIVELY PREVENTING A BROWNOUT CONDITION IN A PERSONAL AUDIO DEVICE

RELATED APPLICATION

The present disclosure claims priority to U.S. Provisional Patent Application Ser. No. 61/834,696, filed Jun. 13, 2013, which is incorporated by reference herein in its entirety.

FIELD OF DISCLOSURE

The present disclosure relates in general to circuits for audio devices, including without limitation personal audio devices such as wireless telephones and media players, and more specifically, to systems and methods for predictively preventing a brownout condition in a personal audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

In general, personal audio devices continue to be reduced in size, yet many users desire louder sound from these personal audio devices. This places physical size constraints on a battery for powering components of the personal audio devices at the same time audio subsystems of such personal audio devices are demanding more output power. With the desire for higher audio volumes and quality, often a boosted supply voltage higher than the battery voltage is generated in order to supply an audio amplifier and deliver more power to the speaker load. As more power is delivered to the speaker load, more strain is placed on the battery of a personal audio device.

A battery includes an output impedance, and thus heavy loading conditions on battery can cause a battery's output voltage to drop. Such drop in output voltage may be more prominent when the battery has a low level of charge. The sudden voltage drop produced by this loading event has the potential to reduce the battery's output voltage to a point where certain subsystems on the device are no longer able to function properly. When the battery is in a weakened or lower charge state and the personal audio device offers no protection against such weakened or lower charge state, often the end result is the personal audio device resetting itself due to a low voltage condition. This self-reset condition may be displeasing to a user of the personal audio device and thus problematic for the provider of the personal audio device (e.g., manufacturer, vendor, reseller, or other provider in a chain of commerce). Such a condition or conditions similar thereto in which an unintentional voltage drop occurs are commonly referred to as "brownout" conditions.

Traditional approaches to mitigation of brownout conditions in personal audio devices have been reactive in nature, in that a reactive brownout reduction system typically identifies the occurrence of a battery voltage falling below a predetermined voltage threshold (e.g., configured by a user or a provider of the personal audio device) and reacts responsive to the battery voltage falling below such threshold. An example of such reaction is a reduction of audio volume in order to reduce an audio amplifier's load on the battery.

This reactive methodology is based on a concept that an undesirable event has already occurred to the battery supply, and thus the personal audio device quickly takes action to reduce loading in order to prevent brownout of the personal audio device. Subsystems other than the audio subsystem and powered by the battery supply may also react independently in order to reduce loading on the battery supply and allow it to return to a safe level in order to maintain functionality of more critical subsystems of the personal audio device. Such reactive approaches do little or nothing to prevent the audio subsystem, and in particular an audio amplifier, from being a cause of the battery supply falling to an undesirable level that may trigger a brownout condition. A reactive brownout reduction system typically has no knowledge of the audio content and by extension, no knowledge of actual power supply loading caused by an audio signal path. Instead, such existing systems typically assume that the loading of an output amplifier of the audio signal path is the source of the supply drop and blindly reduce loading of the output amplifier, even if it is not the main source of the reduction in power supply.

A reactive brownout reduction system requires a certain amount of time to react before the audio signal to the audio amplifier is attenuated. Once the voltage supply of the battery drops, it also takes additional amount of time to attenuate the audio signal and allow the battery supply to return to a "safe" operating voltage. The cumulative initial reaction time, system response time, and the battery supply recovery time may cause the system to spend significant amount of time below the preconfigured threshold voltage of the battery supply.

If the audio system, in particular the audio amplifier, is the primary cause of the battery supply drop, and the battery is in a weakened state, this reactive methodology also has the potential of getting into a state of operation where the audio volume is repeatedly attenuated and then allowed to gain back up. From a user's perspective, this can produce a "pumping" effect of the audio content, where audio volume repeatedly gets louder and softer, as the reactive brownout reduction system may put the reactive brownout response into a continual loop.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, an apparatus for providing an audio output signal to an audio transducer may include a signal path and a predictive brownout prevention system. The signal path may include an audio input configured to receive an audio input signal, an audio output configured to provide an audio output signal, a power supply input configured to receive a power supply, and an attenuation input configured to receive a selectable attenuation signal and generate the audio output signal based on the audio input signal and in conformity with the selectable attenuation signal. The predictive brownout prevention system may be configured to prevent brownout of the audio output signal, wherein the predictive brownout prevention system may be configured to receive information indicative of an amplitude of the audio input signal, receive information indicative of a condition of the power supply, determine from the information indicative of an amplitude of the audio input signal and the information indicative of the condition of the power supply whether a brownout condition exists, and responsive to determining the brownout condition exists, generate the selectable attenuation signal to reduce an amplitude of the audio output signal such that the signal path attenuates the audio input signal or a derivative thereof in order to prevent brownout prior to propagation to the audio output of a portion of the audio input signal having the brownout condition.

In accordance with these and other embodiments of the present disclosure, a method for providing an audio output signal to an audio transducer may include receiving information indicative of an amplitude of an audio input signal. The method may also include receiving information indicative of a condition of a power supply of a signal path having an audio input for receiving the audio input signal and an audio output for providing the audio output signal. The method may further include determining from the information indicative of an amplitude of an audio input signal and the information indicative of the condition of the power supply whether a brownout condition exists. The method may additionally include causing attenuation of the audio input signal or a derivative thereof to reduce an amplitude of the audio output signal in order to prevent brownout prior to propagation to the audio output of a portion of the audio input signal having the brownout condition, responsive to determining the brownout condition exists.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein:

FIG. 8 is a graphical representation of various signals versus time that may be present when a predictive brownout control system triggers attenuation of an audio signal to prevent brownout, in accordance with embodiments of the present disclosure; and FIG. 9 is a graphical representation of various signals versus time that may be present when a predictive brownout control system does not trigger attenuation of an audio signal to prevent brownout, in accordance with embodiments of the present disclosure.

DETAILED DESCRIPTION

Figure 1:
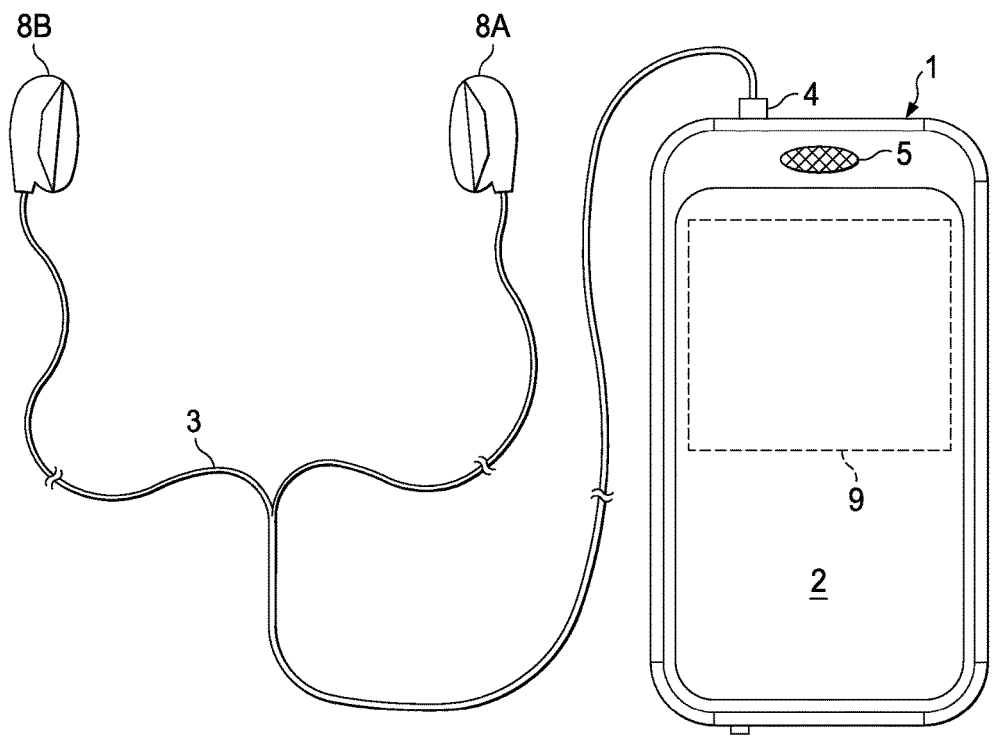
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
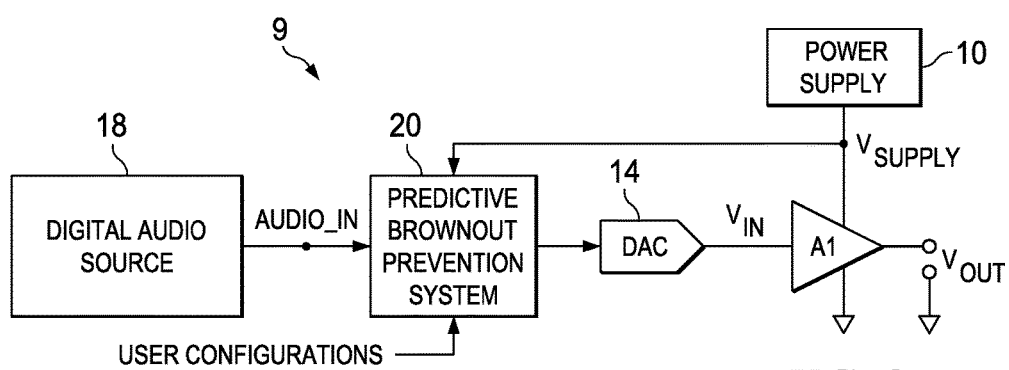
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a digital audio source 18 (e.g., a processor, digital signal processor, microcontroller, test equipment, or other suitable digital audio source) may supply a digital audio input signal AUDIO_IN to a predictive brownout prevention system 20, which may process digital audio input signal AUDIO_IN and provide such processed signal to a digital-to-analog converter (DAC) 14, which may in turn supply an analog audio input signal $V_{IN}$ to a power amplifier stage A1 which may amplify or attenuate the audio input signal $V_{IN}$ and provide an audio output signal $V_{OUT}$, which may operate a speaker, headphone transducer, and/or a line level signal output. Although amplifier A1 is depicted as a single-ended output generating a single-ended audio output signal $V_{OUT}$, in some embodiments, amplifier A1 may comprise a differential output, and may thus provide a differential audio output signal $V_{OUT}$.

A power supply 10 may provide a power supply voltage $V_{SUPPLY}$ to the power supply rail inputs of amplifier A1. Power supply 10 may comprise a charge pump power supply, a switching direct current-to-direct current converter, a linear regulator, or any other suitable power supply.

As discussed in greater detail elsewhere in this disclosure, predictive brownout prevention system 20 may be configured to prevent brownout of audio output signal $V_{OUT}$. As used herein, the term "brownout" broadly refers to an unintentional drop of one or more supply voltages with personal audio device 1, which may lead improper or undesired operation of one or more components receiving such one or more supply voltages. To carry out this functionality, predictive brownout prevention system 20 may receive information indicative of an amplitude of digital audio input signal AUDIO_IN (e.g., by monitoring a characteristic indicative of an amplitude of digital audio input signal AUDIO_IN). Although many embodiments disclosed herein contemplate such monitoring as carried out by directly extracting amplitude information from digital audio input signal AUDIO_IN or a buffered version thereof, in other embodiments, such monitoring may be of any signal derivative of digital audio input signal AUDIO_IN (e.g., any signal within the signal path from digital audio input signal AUDIO_IN to audio output signal $V_{OUT}$). Predictive brownout prevention system 20 may also receive information indicative of a condition of power supply 10. In some embodiments, the condition of power supply 10 may be indicative of a maximum amplitude of audio output signal $V_{OUT}$ that may be output by amplifier A1 or a supply current consumed by amplifier A1 triggering a brownout condition occurring or violating a user-defined or other type of threshold indicating a brownout condition. As used throughout this disclosure, the term "brownout condition" may broadly refer to a condition or situation in which a brownout may actually occur, or a condition or situation wherein a brownout may potentially occur, based on parameters measured by predictive brownout prevention system, as described in greater detail elsewhere in this disclosure. In these and other embodiments, the condition of power supply 10 may be determined by at least one of power supply voltage $V_{SUPPLY}$, a current of power supply 10, an internal impedance of power supply 10, impedances external to power supply 10, and a predicted behavior of power supply 10 in response to loading conditions of power supply 10.

Predictive brownout prevention system 20 may determine from the physical quantity indicative of an amplitude of digital audio input signal AUDIO_IN and the information indicative of the condition of power supply 10 whether a brownout condition exists wherein the audio output signal $V_{OUT}$ would brownout responsive to digital audio input signal AUDIO_IN in the absence of attenuation within the signal path from digital audio input signal AUDIO_IN to audio output signal $V_{OUT}$. Responsive to determining the brownout condition exists, predictive brownout prevention system 20 may generate a selectable attenuation signal to reduce an amplitude of audio output signal $V_{OUT}$ such that the signal path attenuates digital audio input signal AUDIO_IN or a derivative thereof in order to prevent brownout prior to propagation to the audio output of amplifier A1 of a portion of digital audio input signal AUDIO_IN having the brownout condition. In some embodiments, such attenuation may include reducing an audio volume of digital audio input signal AUDIO_IN or a derivative thereof within the signal path.

In some embodiments, attenuation may include applying a non-linear gain to digital audio input signal AUDIO_IN or a derivative thereof within the signal path. In some embodiments, applying a non-linear gain may include clipping digital audio input signal AUDIO_IN or a derivative thereof to a maximum amplitude. For example, such attenuation or clipping make take place in a digital path portion of the signal path (e.g., between digital audio source 18 and DAC 14). Alternatively or in addition, such attenuation (whether linear or non-linear) or clipping may take place in an analog path portion of the signal path (e.g., between DAC 14 and the output node), such as by applying a variable gain to an output stage of DAC 14 and/or a variable gain to amplifier A1.

In these and other embodiments, as described in greater detail below, attenuation may include soft clipping the audio input signal or the derivative thereof with a gain transfer function whose mathematical derivative is a continuous function. For example, soft clipping may be applied by an arctangent filter to the audio input signal or the derivative thereof.

Figure 3:
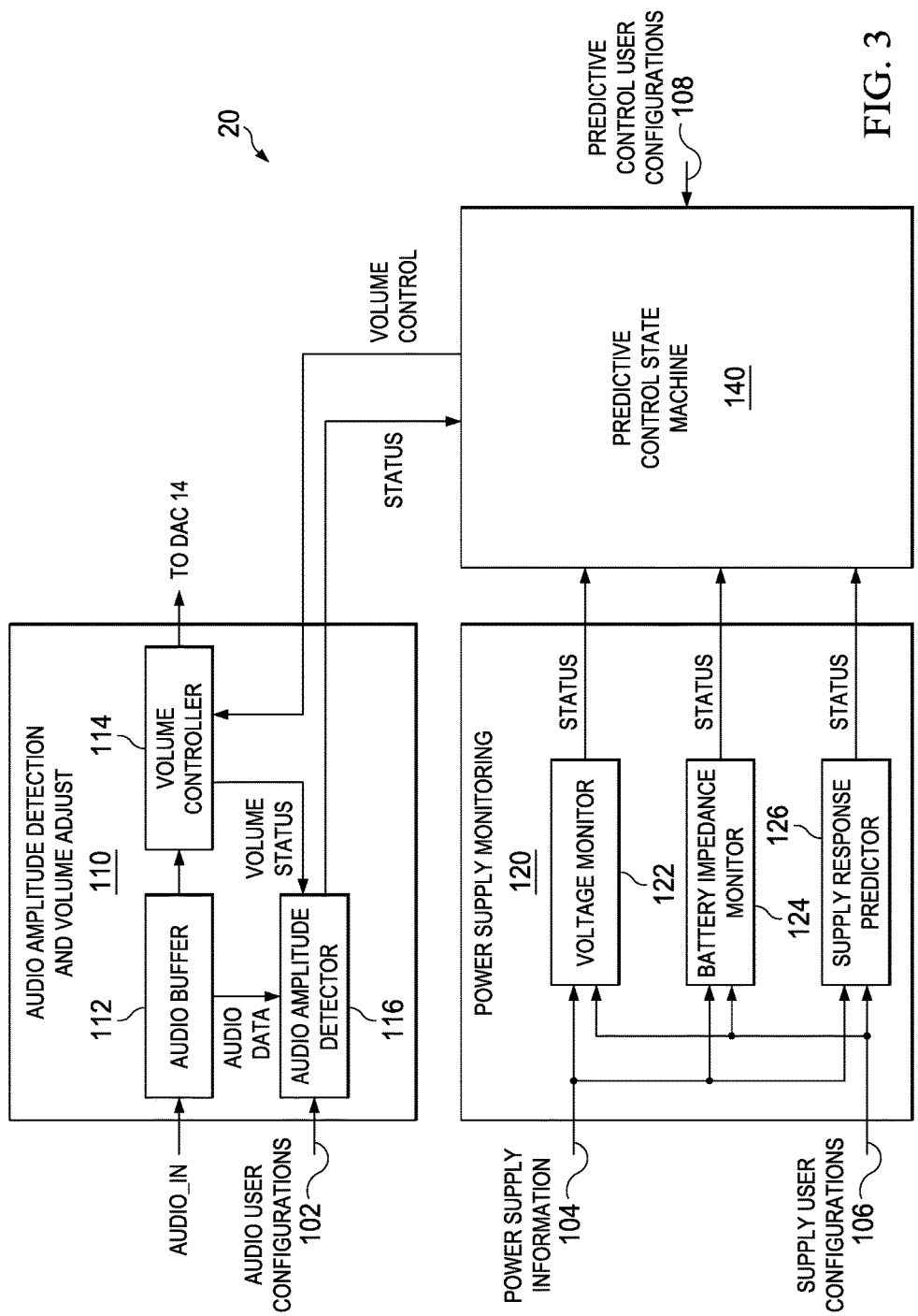
FIG. 3 is a block diagram of selected components of a predictive brownout prevention system for use within the audio integrated circuit depicted in FIG. 2, in accordance with embodiments of the present disclosure.

FIG. 3 a block diagram of selected components of an example predictive brownout prevention system 20, in accordance with embodiments of the present disclosure. In the embodiments represented by FIG. 3, predictive brownout prevention system 20 may include an audio amplitude detection and volume adjust block 110, a power supply monitoring block 120, and a predictive control state machine block 140.

User configurations, including audio user configurations 102, supply user configurations 106, and/or predictive control user configurations 108 may be applied to volume adjust block 110, power supply monitoring block 120, and predictive control state machine block 140, respectively. Audio user configurations 102 may include, but are not limited to, the ability to manipulate audio amplitude detector 116. These user configurations may allow the user to set such detection parameters that include, but are not limited to, peak-level thresholds, root-mean-squares-level thresholds, frequencies and/or durations of concern, and/or the load impedance on the amplifier. Supply user configurations 106 may include, but are not limited to, the ability of the user to set various voltage, impedance, current consumption, and/or behavioral thresholds of the battery supply and/or power behavior characteristics of audio IC 9. These thresholds may allow the user to customize when a battery is considered to be in a weakened state of operation that may produce a voltage drop when under load. Predictive control user configurations 108 may allow the user the ability to manipulate the response of the predictive brownout prevention system 20. These may include, but are not limited to, volume adjustments, control delays, masking or weighting of supply information relative to the audio content, and at what types and thresholds of audio content to predictively attenuate.

User configurability of predictive brownout prevention system 20 may be desirable as each different design of a portable audio device may have different parameters of concern, including without limitation different battery output voltages, different battery characteristics, a different audio amplifier, and/or a different audio load. This variation of the system requirements and parameters for different personal audio devices may dictate that the audio monitoring of amplitude detection and volume adjust block 110, the supply monitoring of power supply monitoring block 120, and control by predictive control state machine block 140 should be flexible, adaptable, and user configurable so that predictive brownout prevention may be appropriately optimized for each personal audio device. While user flexibility to "tune" a response of predictive brownout prevention system 20 may be desirable in some instances, in some embodiments, some or all of parameters associated with audio user configurations 102, supply user configurations 106, and/or predictive control user configurations 108 may be fixed to a specific set of values (e.g., by a provider of a personal audio device).

As shown in FIG. 3, power supply monitoring block 120 may comprise voltage monitor 122, battery impedance monitor 124, and supply response predictor 126. Voltage monitor 122 may be configured to receive power supply information 104 and perform a comparison of a voltage of a battery for supplying power for power supply 10 against, for example, a user-configurable threshold set within supply user configurations 106. A user may have the flexibility to determine such voltage threshold and adjust it based on the requirements of the other components within personal audio device 1. In some embodiments, multiple voltage thresholds may be set within supply user configurations 106, which would allow predictive control state machine 140 to monitor for and react to different levels of predictive audio loading from the audio amplitude detector 116.

Battery impedance monitor 124 may be configured to receive power supply information 104 and record recent loading conditions and track the effect of changes in current consumption which may produce corresponding changes in battery impedance. As a battery becomes "weaker" via its level of charge, discharge current, aging of the battery, and/or environmental effects, its output impedance may increase. Under no load, the battery's output impedance may have little effect on the battery's output voltage. However, the output impedance has a significant impact on the voltage produced on the output terminals of the battery when current is being provided. If power supply 10 comprises a direct current-to-direct current converter, such as a boost converter, buck converter, linear regulator, or charge pump, to regulate the $V_{SUPPLY}$ voltage to the amplifier A1, the direct current-to-direct current converter's characteristics may be encompassed as a part of the power supply information 104, battery impedance monitor 124, or supply response predictor 126.

Figure 4:
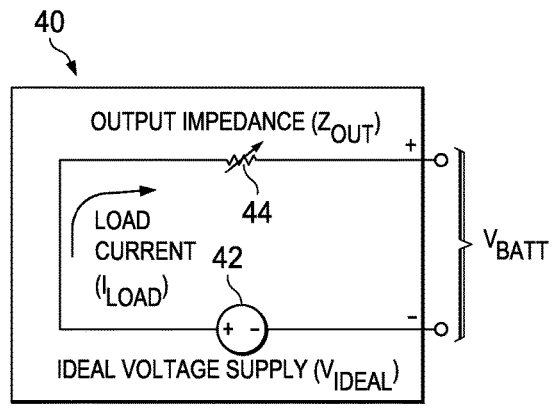
FIG. 4 is a circuit diagram of a model of an example battery, in accordance with embodiments of the present disclosure.
Figure 5:
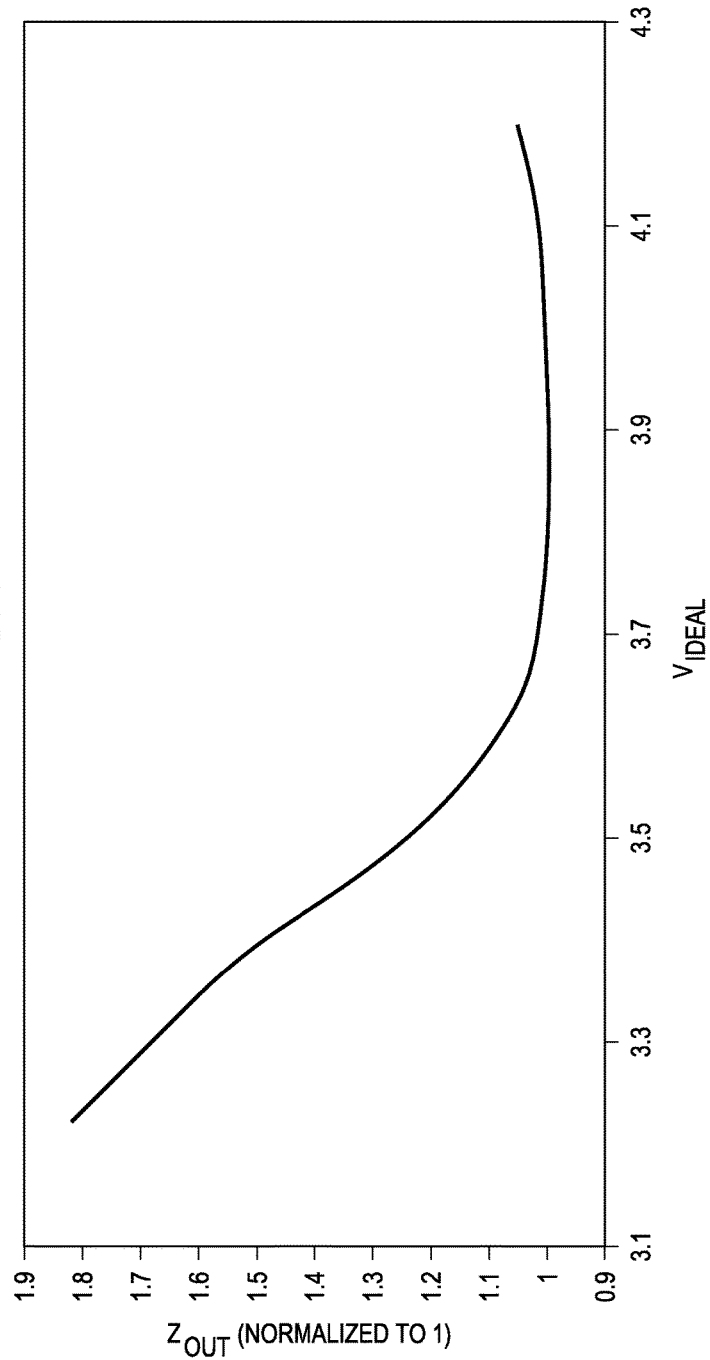
FIG. 5 is a graph showing an example relationship between output impedance and battery charge voltage of the model of the example battery depicted in FIG. 4, in accordance with embodiments of the present disclosure.

FIG. 4 is a circuit diagram of a model 40 of an example battery, in accordance with embodiments of the present disclosure. As shown in FIG. 4, a battery may be modeled as having an ideal voltage supply 42 outputting a voltage $V_{IDEAL}$ and an output impedance 44 with a variable impedance $Z_{OUT}$ which may vary due to change in level of battery charge, discharge current, aging of the battery, and/or environmental effects. FIG. 5 is a graph showing an example relationship between output impedance and battery charge voltage of the model 40 depicted in FIG. 4, in accordance with embodiments of the present disclosure, which shows that variable impedance $Z_{OUT}$ which may vary due to change in level of battery charge. As current $I_{LOAD}$ delivered from a battery increases, the output voltage $V_{BATT}$ it generates (and which may be delivered to power supply 10 to provide power to elements of audio IC 9) may decrease. Battery impedance monitor 124 may monitor the variance of this variable impedance $Z_{OUT}$, and if applicable, an additional impedance external to the battery (e.g., those present on power supply voltage $V_{SUPPLY}$ to amplifier A1).

Supply response predictor 126 may be configured to receive power supply information 104 and predict future behavior of a battery supply under various loading conditions based on monitoring recent behavioral history of the battery supply. An audio amplifier (e.g., amplifier A1) may not have enough system-level visibility to be able to determine the total absolute loading on the battery supply at any given time. However, supply response predictor 126 may be able to determine what an amplifier's loading contribution is on a battery supply and monitor how the battery supply responds to the changes in loading produced by the amplifier. Such information enables supply response predictor 126 to estimate how large of a supply voltage drop may occur when a certain amount of current is consumed by amplifier A1. When the status of supply response predictor 124 is combined with status of voltage monitor 122, status of battery impedance 124, and status of audio amplitude detector 116, predictive control state machine 140 may determine how large of an audio output signal $V_{OUT}$ may be produced by amplifier A1 without producing a large enough voltage drop in a battery powering amplifier A1 in order to trigger a brownout condition.

As shown in FIG. 3, audio amplitude detection and volume adjust block 110 may comprise an audio buffer 112, volume controller 114, and audio amplitude detector 116, and may be configured to monitor and manipulate the digital audio input signal AUDIO_IN or a derivative thereof. Portions of audio amplitude detection and volume adjust block 110 (e.g., audio buffer 112, volume controller 114) may be integral to the signal path from digital audio input signal AUDIO_IN to audio output signal $V_{OUT}$. In some embodiments, all or a portion of the functionality of audio amplitude detection and volume adjust block 110 may be integral to amplifier A1. In these and other embodiments, all or a portion of the functionality of audio amplitude detection and volume adjust block 110 may be implemented in software or firmware. Thus, one or more features of audio amplitude detection and volume adjust block 110 may be implemented as software or firmware, as one or more separate or integrated pieces of hardware relative to amplifier A1, or any combination thereof.

Audio buffer 112 may any system, device, or apparatus that provides a delay to allow the audio amplitude detector 116 and/or predictive control state machine 140 adequate time to react prior to digital audio input signal AUDIO_IN propagating through the signal path. For example, audio buffer 112 may provide sufficient delay such that its delay plus the group delay of the signal path up to volume controller 114 is greater than the processing time of audio amplitude detector 116, predictive control state machine 140, and volume controller 114. In some embodiments, audio buffer 112 may comprise a memory. In these and other embodiments audio buffer 112 may include an intrinsic group delay of an audio path, delay caused by audio processing, and/or other suitable delay.

In more robust audio amplifier systems, an audio data path memory buffer is often available as a part of another feature that may also need a look-ahead or some time for preprocessing. When this is the case, the same memory buffer can be utilized as audio buffer 112 for predictive brownout prevention as long as it is large enough and has sufficient delay to allow for processing of other components of predictive brownout prevention system 20.

In some embodiments, an overall delay within a signal path may be sufficiently large enough to allow for processing by components of predictive brownout prevention system 20. In such embodiments, audio buffer 112 may not be present.

In the embodiments represented by FIG. 3, audio amplitude detector 116 may monitor digital audio input signal AUDIO_IN entering audio buffer 112. In such embodiments, audio amplitude detector 116 may evaluate such audio data against one or more thresholds (e.g., set within audio user configurations 102) in order to identify any incoming audio signals that may produce a loading condition large enough to put a strain on the battery supply powering power supply 10, producing a voltage drop, and risking a brownout condition if such audio signal is reproduced by audio amplifier A1. A status determination generated by audio amplitude detector 116 and provided to predictive control state machine block 140 may be based on any number and type of parameters including, but not limited to, a physical quantity of the audio signal (e.g., frequency, peak amplitude, power, etc.), characteristics of amplifier A1 (e.g., efficiency), and/or load impedance of an output of amplifier A1.

Although FIG. 3 depicts audio amplitude detector 116 monitoring digital audio input signal AUDIO_IN, in other embodiments audio amplitude detector 116 may detect a derivative of digital audio input signal AUDIO_IN elsewhere within the signal path of audio IC 9.

Figure 6:
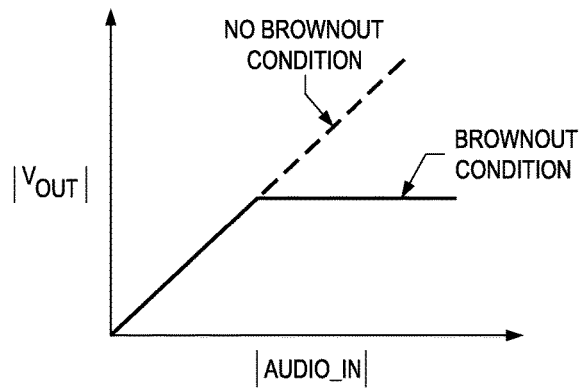
FIG. 6 is a graph of an example gain transfer function, in accordance with embodiments of the present disclosure.
Figure 7:
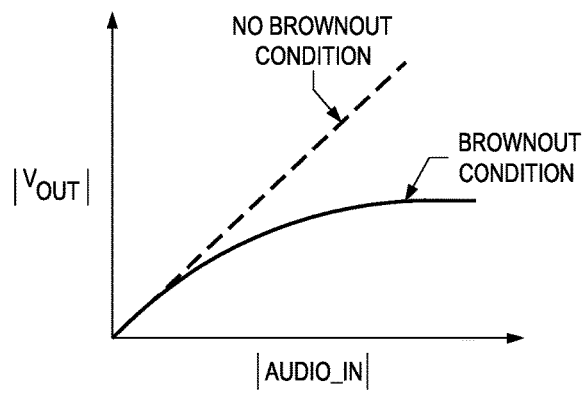
FIG. 7 is a graph of another example gain transfer function, in accordance with embodiments of the present disclosure.

Volume controller 114 may comprise any system, device, or apparatus configured to, based on a volume control signal generated by predictive control state machine 140, control a volume of or otherwise apply a selectable gain to the audio signal buffered by audio buffer 112 (e.g., prior to communication of the audio signal to DAC 14). Thus, in situations where predictive control state machine 140 determines a brownout condition exists, it may communicate the volume control signal, and in response thereto, volume controller 114 may attenuate the audio signal propagating through the audio signal path. In some embodiments, the volume controller 114 may attenuate the audio signal by reducing an audio volume of the audio signal. In these and other embodiments, the volume controller 114 may attenuate the audio signal in response to a brownout condition by applying a non-linear gain to the audio signal. For example, as shown in FIG. 6, volume controller 114 may apply "hard-clipping" to the audio signal in response to a brownout condition such that a gain transfer function (e.g., f(|VOUT(|AUDIO_IN|)|) for the audio signal may be such that the mathematical derivative of the gain transfer function includes at least one point of discontinuity. As another example, as shown in FIG. 7, volume controller 114 may apply "soft-clipping" to the audio signal in response to a brownout condition such that the gain transfer function for the audio signal may be such that the mathematical derivative of the gain transfer function is a continuous function. Such a soft-clipping gain transfer function may be implemented in any suitable manner, including by applying an arctangent filter to the audio signal.

As shown in FIG. 3, predictive control state machine 140 may receive status information from audio amplitude detector 116, voltage monitor 122, battery impedance monitor 124, and supply response predictor 126 and, based on such status information, determine whether to attenuate (e.g., reduce an audio volume via volume controller 114) digital audio input signal AUDIO_IN (or a derivative thereof) in order to protect from a battery supply voltage drop that might occur if such signal were not attenuated. In addition, once in a state in which brownout-prevention attenuation is taking place, predictive control state machine 140 may, based on such status information, determine whether to allow audio signal amplitude to return to its non-attenuated level.

If the statuses of voltage monitor 122, supply response predictor 126, and battery impedance monitor 124 indicate that the battery is in a weakened state and audio amplitude detector 116 indicates that a high loading condition is about to occur, predictive control state machine 140 may react by communicating an appropriate volume control signal to volume controller 114, causing volume controller 114 to attenuated the audio signal. Accordingly, by the time an audio signal potentially causing brownout is communicated to amplifier A1, it may be attenuated to a level sufficiently low enough the prevent brownout.

FIG. 8 is a graphical representation of various signals versus time that may be present when a predictive brownout control system triggers attenuation of an audio signal to prevent brownout, in accordance with embodiments of the present disclosure. In FIG. 8, statuses of voltage monitor 122, battery impedance monitor 124, and supply response predictor 126 are shown as indicating that a battery powering power supply 10 is in a state weak enough such that it is not able to support the incoming audio signal AUDIO_IN without triggering a brownout condition once the audio signal propagates to amplifier A1 and loads down the battery powering power supply 10. This may cause predictive control state machine 140 to generate an appropriate volume control signal to attenuate the audio signal responsive to analyzing information received from audio amplitude detector 116 and power supply monitoring 120 (e.g., responsive to an indication that an audio amplitude is above a threshold level likely to cause a brownout condition). In some embodiments, the audio signal may be attenuated in amplitude steps of $VOL_{STEP1}$ for each time period $t_{ATTACK}$ that the audio amplitude of the audio signal monitored by audio amplitude detector 116 remains above the threshold. Once the audio amplitude of the audio signal monitored by audio amplitude detector 116 falls below the threshold (or another threshold), the attenuation may be continued for a period $t_{WAIT}$, after which the audio signal may be unattenuated in steps of $VOL_{STEP2}$ for each time period $t_{RELEASE}$ until returning to a normal state of operation with little or no audio attenuation.

FIG. 9 is a graphical representation of various signals versus time that may be present when a predictive brownout control system does not trigger attenuation of an audio signal to prevent brownout, in accordance with embodiments of the present disclosure. As shown in FIG. 9, audio amplitude detector 116 indicates that an audio amplitude is below a threshold level likely to cause a brownout condition. However, in the scenario presented in FIG. 9, large audio amplitudes may only be present when voltage monitor 122, battery impedance monitor 124, and/or supply response predictor 126 report that power supply 10 is capable of handling the loading caused by such audio amplitude. Such large audio amplitudes may not occur when a battery powering power supply 10 is in a weakened state, as indicated by statuses of voltage monitor 122, battery impedance monitor 124, and/or supply response predictor 126. Accordingly, under this set of circumstances, predictive control state machine 140 may not cause attenuation of the audio signal.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus comprising:
    a signal path for receiving an audio input signal and having an amplifier for generating an audio output signal as a function of the audio input signal, wherein the amplifier is powered from a power supply; and
    a predictive brownout prevention system coupled to the signal path and configured to:
        predict a brownout condition of the power supply in response to determining that an uncontrolled audio output signal of the amplifier responsive to the audio input signal would cause the amplifier to overload the power supply and cause brownout of the power supply; and
        control the audio output signal to prevent the brownout condition by preventing the uncontrolled audio output signal from propagating to an output of the amplifier.

2. The apparatus of claim 1, wherein the predictive brownout prevention system is further configured to:
    predict behavior of the power supply in the event that the power supply were to be loaded by the amplifier generating the uncontrolled audio output signal;
    determine if such behavior would cause a parameter of the power supply to exceed a limit associated with the parameter; and
    predict the brownout condition if such behavior would cause the parameter of the power supply to violate the limit associated with the parameter.

3. The apparatus of claim 2, wherein the parameter comprises a current generated by the power supply.

4. The apparatus of claim 2, wherein the parameter comprises a voltage generated by the power supply.

5. The apparatus of claim 4, wherein the predictive brownout prevention system is further configured to:
    determine a decrease in the voltage that would occur if the power supply were to be loaded by the amplifier generating the uncontrolled audio output signal; and
    predict the brownout condition if the decrease would cause the voltage to violate the limit associated with the parameter.

6. The apparatus of claim 2, wherein the predictive brownout prevention system is further configured to predict the behavior of the power supply based on one or more of an internal impedance of the power supply, a load impedance of the amplifier, and the audio input signal.

7. The apparatus of claim 1, wherein the signal path further comprises a buffer configured to delay propagation of the audio input signal to an audio output of the amplifier for a duration sufficient to permit the predictive brownout prevention system to control the audio output signal before propagation of the audio input signal to the audio output.

8. The apparatus of claim 1, wherein the predictive brownout prevention system controls the audio output signal by attenuating the audio input signal or a derivative thereof.

9. The apparatus of claim 8, wherein the predictive brownout prevention system attenuates the audio input signal or the derivative thereof by applying a non-linear gain to the audio input signal or the derivative thereof.

10. The apparatus of claim 9, wherein the predictive brownout prevention system attenuates the audio input signal or the derivative thereof by clipping the audio input signal or the derivative thereof.

11. The apparatus of claim 10, wherein the predictive brownout prevention system causes the clipping of the audio input signal or the derivative thereof by a digital path portion of the signal path.

12. The apparatus of claim 10, wherein the predictive brownout prevention system causes the clipping of the audio input signal or the derivative thereof by an analog path portion of the signal path.

13. The apparatus of claim 10, wherein the predictive brownout prevention system causes the clipping of the audio input signal or the derivative thereof by soft clipping the audio input signal or the derivative thereof with a gain transfer function whose mathematical derivative is a continuous function.

14. The apparatus of claim 13, wherein the soft clipping is applied by an arctangent filter to the audio input signal or the derivative thereof.

15. A method comprising, in an apparatus including a signal path for receiving an audio input signal and having an amplifier for generating an audio output signal as a function of the audio input signal, wherein the amplifier is powered from a power supply:
    predicting a brownout condition of the power supply in response to determining that an uncontrolled audio output signal of the amplifier responsive to the audio input signal would cause the amplifier to overload the power supply and cause brownout of the power supply; and
    controlling the audio output signal to prevent the brownout condition by preventing the uncontrolled audio output signal from propagating to an output of the amplifier.

16. The method of claim 15, further comprising:
    predicting behavior of the power supply in the event that the power supply were to be loaded by the amplifier generating the uncontrolled audio output signal;
    determining if such behavior would cause a parameter of the power supply to exceed a limit associated with the parameter; and
    predicting the brownout condition if such behavior would cause the parameter of the power supply to violate the limit associated with the parameter.

17. The method of claim 16, wherein the parameter comprises a current generated by the power supply.

18. The method of claim 16, wherein the parameter comprises a voltage generated by the power supply.

19. The method of claim 18, further comprising:
    determining a decrease in the voltage that would occur if the power supply were to be loaded by the amplifier generating the uncontrolled audio output signal; and predicting the brownout condition if the decrease would cause the voltage to violate the limit associated with the parameter.

20. The method of claim 16, further comprising predicting the behavior of the power supply based on one or more of an internal impedance of the power supply, a load impedance of the amplifier, and the audio input signal.

21. The method of claim 15, wherein the signal path further comprises a buffer configured to delay propagation of the audio input signal to an audio output of the amplifier for a duration sufficient to permit a predictive brownout prevention system to control the audio output signal before propagation of the audio input signal to the audio output.

22. The method of claim 15, further comprising controlling the audio output signal by attenuating the audio input signal or a derivative thereof.

23. The method of claim 22, further comprising attenuating the audio input signal or the derivative thereof by applying a non-linear gain to the audio input signal or the derivative thereof.

24. The method of claim 23, further comprising attenuating the audio input signal or the derivative thereof by clipping the audio input signal or the derivative thereof.

25. The method of claim 24, further comprising causing the clipping of the audio input signal or the derivative thereof by a digital path portion of the signal path.

26. The method of claim 24, further comprising causing the clipping of the audio input signal or the derivative thereof by an analog path portion of the signal path.

27. The method of claim 24, further comprising causing the clipping of the audio input signal or the derivative thereof by soft clipping the audio input signal or the derivative thereof with a gain transfer function whose mathematical derivative is a continuous function.

28. The method of claim 27, wherein the soft clipping is applied by an arctangent filter to the audio input signal or the derivative thereof.

* * * * *